United States Patent [19]

Davidsohn, deceased et al.

[11] 3,876,480

[45] Apr. 8, 1975

[54] METHOD OF MANUFACTURING HIGH SPEED, ISOLATED INTEGRATED CIRCUIT

[75] Inventors: Uryon S. Davidsohn, deceased, late of Scottsdale, Ariz.; by Amil J. Ajamie, administrator, Phoenix, Ariz.

[73] Assignee: Motorola, Inc., Franklin Park, Ill.

[22] Filed: Sept. 13, 1973

[21] Appl. No.: 396,930

Related U.S. Application Data

[62] Division of Ser. No. 284,305, Aug. 28, 1972, abandoned.

[52] U.S. Cl. .................. 156/17; 117/212; 117/215; 148/175; 148/187; 156/7; 357/47; 357/49

[51] Int. Cl. .............................................. H01l 7/50

[58] Field of Search ........... 252/79.5; 148/175, 187; 29/576, 580, 583; 117/212, 215, 106 A; 317/234 Q, 235 E, 235 F, 235 AA; 156/7, 17

[56] References Cited

UNITED STATES PATENTS

| | | | |
|---|---|---|---|
| 3,478,418 | 11/1969 | Pomante | 29/574 |
| 3,623,219 | 11/1971 | Stoller et al. | 29/580 |
| 3,746,587 | 7/1973 | Rosvold | 148/175 |

*Primary Examiner*—William A. Powell
*Attorney, Agent, or Firm*—Vincent J. Rauner; Kenneth R. Stevens

[57] ABSTRACT

Extremely high speed, low parasitic capacitance, isolated integrated circuits utilizing very thin epitaxial monocrystalline material in which active devices are formed, is taught. The very thin epitaxial layer is grown over an area that has been diffused with a selected impurity within a monocrystalline substrate. This is accomplished by diffusing from one side of the substrate and then growing the epitaxial layer on the other side, after sufficient material has been removed from the other side to reach the diffused region. The impurity concentration at the surface of the substrate into which the impurities were introduced is much higher than on the other side where the epitaxial layer is grown, making it possible to obtain a very thin epitaxial layer without faults. The very thin epitaxial layer makes unique integrated circuit configuration possible.

10 Claims, 11 Drawing Figures

METHOD OF MANUFACTURING HIGH SPEED, ISOLATED INTEGRATED CIRCUIT

This is a division of application Ser. No. 284,305, filed Aug. 28, 1972, now abandoned.

BACKGROUND OF THE INVENTION

This invention pertains to electronic integrated circuits. More specifically, it relates to circuits isolated from each other and capable of extremely high speed operation. The integrated circuits are formed by diffusion techniques.

To increase speed, it has been common practice in the past to dielectrically isolate circuits from each other using an oxide barrier to accomplish the isolation and also by providing a low resistivity path for the collector current of a formed transistor through the use of a buried layer. The buried layer is a well known technique which reduces the resistance component of the RC time constant present.

Efforts have been made to reduce the physical size of the integrated circuits, thus reducing parasitic capacitance and resistance. However, significant reductions in size have been difficult of achievement. For example, the use of an oxide layer to achieve dielectric isolation has been very effective because of the reduction in per unit capacitance. A point is reached where the addition of the oxide layer significantly increases the overall size and therefore the benefit of reduced unit capacitance is lost. Also, transistor elements have been diffused into epitaxial layers over buried layers, the idea being to keep the epitaxial layer as thin as possible, thereby enabling very thin diffusion areas. The problem with this technique has been that the epitaxial layer must be grown at some finite distance from the buried layer to avoid faults in the epitaxial growth resulting in the formation of defective transistors. Therefore, the overall size is not significantly reduced because of the required distance from the epitaxial layer to the buried layer, which increases resistance and capacitance.

My invention permits the growth of an epitaxial layer on or very near the buried layer without faults occurring in the epitaxial growth. Therefore, the epitaxial layer may be grown very thin and of consistent dimension. Very small diffusion regions can then be formed immediately adjacent the buried layer. The end result is a very small, low resistance, low capacitance transistor. The very thin epitaxial layer provides high resistivity, the very small diffused regions of the transistor greatly reduces wall capacitance and the very nature of the structure permits a number of significant variations to achieve isolation from one device to the next.

BRIEF SUMMARY OF THE INVENTION

In the preferred embodiment, a monocrystalline silicon P− conductivity type wafer is used as a substrate. An N+ diffusion is made from a first surface of the substrate. Then a silicon dioxide layer is formed thermally or by deposition and a supporting layer usually of a polycrystalline silicon is formed over the oxide layer.

In essence, the structure is now turned over and the other side of the substrate is worked. The monocrystalline silicon is removed by conventional techniques such as lapping and/or etching until the diffused region is reached or nearly reached. The diffused region that is reached has a low concentration of impurity as compared to the other side of the substrate from which the diffusion was made because of the nature of the diffusion process. This fact is important to this invention because it permits the growth of an epitaxial layer directly over the diffused buried layer without faults occurring in the epitaxial layer.

A very thin epitaxial layer with a rigidly controlled thickness dimension may be used, for example, as the collector of a transistor which is immediately adjacent a buried layer. The base and emitter of the transistor may now be diffused into the epitaxial layer forming a very small transistor which is immediately adjacent a buried layer. The thin epitaxial layer provides relatively high resistivity in a lateral direction and the buried layer provides a relatively low resistance path. Further, the distance from the epitaxial layer to the silicon dioxide layer is made smaller, thus further reducing parasitic capacitance.

The formed transistor may be further isolated from its neighbor by etching through the epitaxial layer just into the substrate or by etching entirely through the substrate as well to the silicon dioxide layer. These 2 etches provide air gap dielectric isolation of a lesser and greater degree respectively. Also, a diffusion isolation barrier could be introduced as a diffusion made at the time of the formation of the buried layer and then as a diffusion into the epitaxial layer. It should be noted that since the epitaxial layer is thin, the diffusion barrier is much more easily controlled and does not spread to the extent that it does in the prior art.

Other embodiments of this invention are discussed in detail in the description that follows. As mentioned earlier, the ability to grow a very thin epitaxial layer over and directly adjacent to a buried layer enables the implementation of unique isolation techniques.

A primary object of this invention is to provide a very small high speed integrated circuit and a method for its manufacture.

Another object is to provide a method for growing a substantially faultless, very thin epitaxial layer over a buried layer.

Still another object is to provide very high speed integrated circuits that are very well isolated from each other.

These and other objects will be made more clear in the detailed description that follows.

BRIEF DESCRIPTION OF DRAWINGS

FIGS. 3A through 3E illustrate a third embodiment of this invention.

Figure 1:
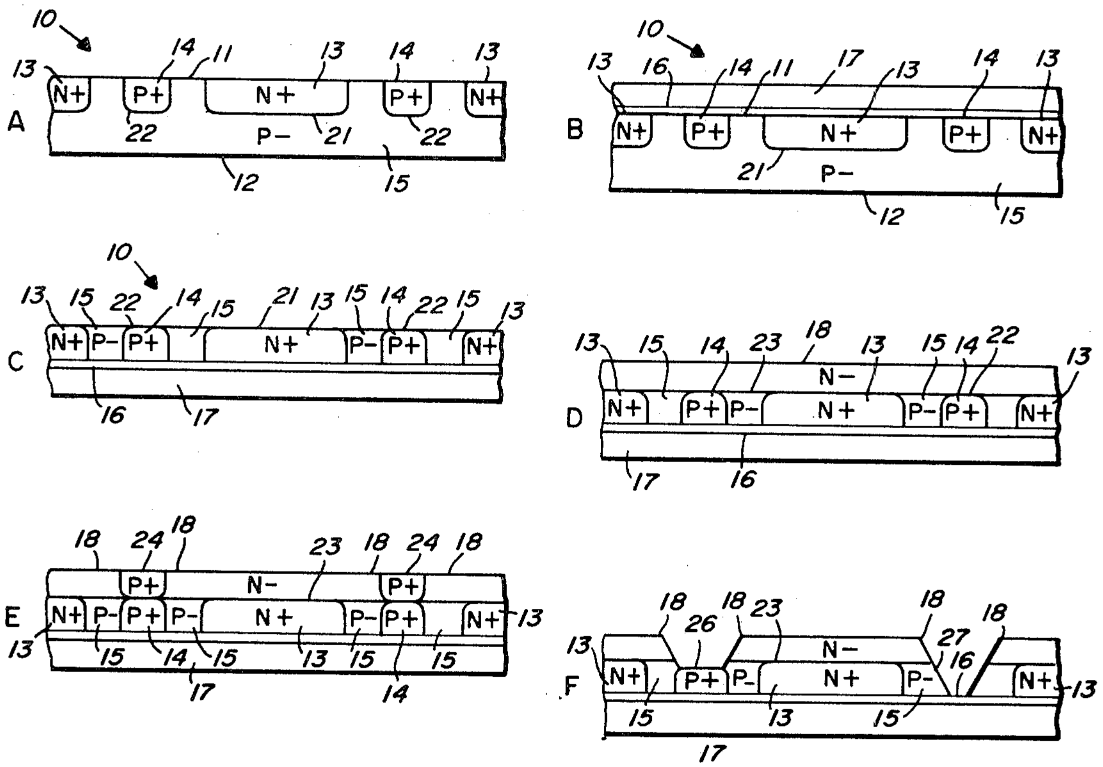
FIGS. 1A through 1E illustrate successive steps in the process of manufacturing one embodiment of this invention.
FIG. 1F illustrates two possible variations in the embodiment as shown in FIGS. 1A through 1E.

Referring first to FIG. 1A, an integrated structure 10 is shown. A P− conductivity type monocrystalline silicon forms a substrate 15 in which are located N+ conductivity type regions 13 and P+ conductivity type regions 14. The regions 13 are formed by well known diffusion techniques resulting in a gradient of diffused impurities with the heaviest concentration at the surface 13 and the least concentration at the junction 21. Likewise, the P+ regions 14 are formed by the well known diffusion technique with the highest concentration of impurities at surface 14 and the least concentration at the junction 22.

FIG. 1B illustrates the next sequential step in the process of manufacturing the circuit of this invention. A silicon dioxide layer 16 is shown formed over substrate 15 on its surface 11. Also shown is polycrystalline silicon support member 17 deposited, by well known means, over silicon dioxide layer 16.

In FIG. 1C, the structure is shown upside down from FIG. 1B. The surface 12 substrate 15 has been shaped back by known techniques to a point where the N+ regions 13 have been exposed. The junction 21 now represents the top surface of N+ regions 13.

In FIG. 1D an epitaxial layer 18 is shown after having been grown on the substrate 15 and over the top edges 21 of N+ regions 13.

FIG. 1E illustrates one preferred embodiment of this invention. A P+ region 24 is shown diffused into epitaxial layer 18 in line with the P+ region 14 to form a complete diffusion isolation barrier. The diffusion regions 14 and 24 represent one method of providing isolation. Alignment of the original diffused area 14 with diffused area 24 is accomplished by well known keying techniques. Any desired semiconductive device can now be formed between isolation barrier pairs 14 and 24.

FIG. 1F illustrates two structural variations for isolating a semiconductive device from its neighbors. Instead of using a diffusion barrier technique such as that formed by diffusion regions 14 and 24 of FIG. 1E, an air dielectric barrier technique may be used. Channel 26 is the result of an etching process through the epitaxial layer 18 and into the substrate 15. The etching may be done with KOH. Channel 26 provides air dielectric isolation in the lateral direction.

Channel 27 illustrates the result of etching completely through substrate 15 to the silicon dioxide layer 16 providing more air dielectric isolation than that provided by channel 26.

Figure 2:
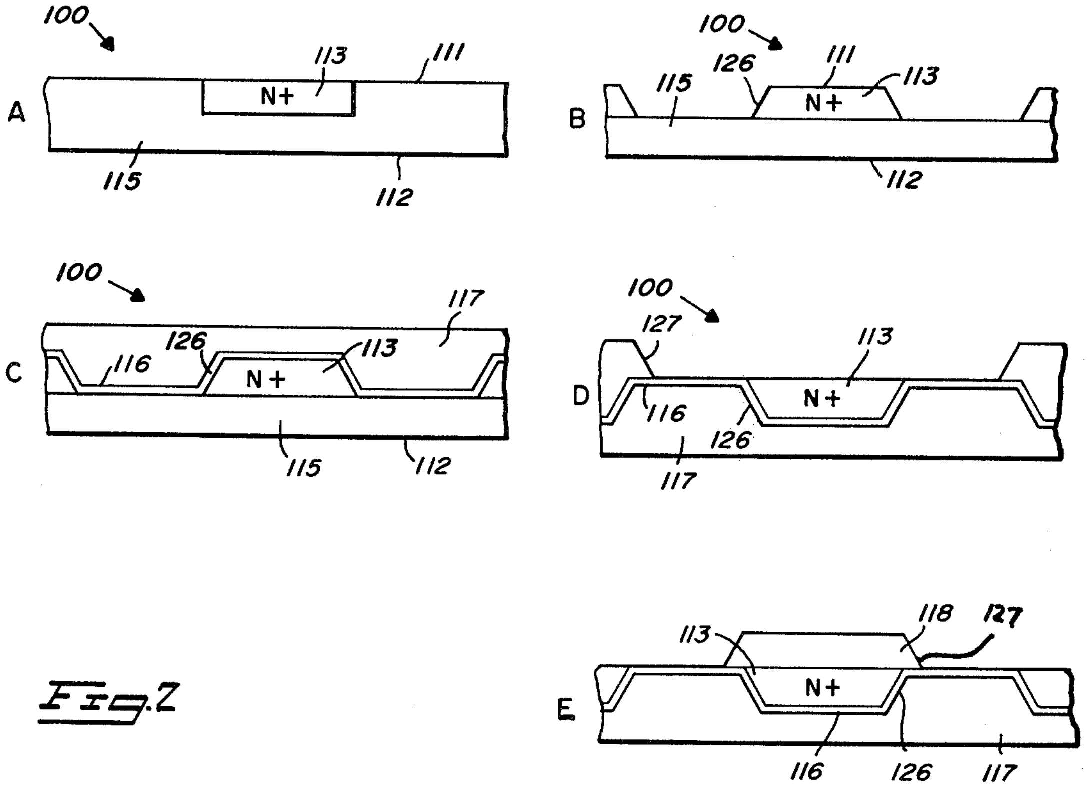
FIGS. 2A through 2E illustrate another embodiment of this invention.

FIG. 2 illustrates another embodiment of this invention. Starting at FIG. 2A, a monocrystalline silicon 115 with an N+ diffusion 113 is shown.

FIG. 2B illustrates channels 126 having been etched into substrate 115 from its surface 111. A defined region 113 remains after the etch.

As in the embodiment of FIG. 1, FIG. 2C illustrates a silicon dioxide layer 116 formed over surface 111. Support member 117 of polycrystalline silicon is deposited over silicon dioxide layer 116.

FIG. 2D illustrates the structure 100 having been turned over and substrate 115 having been etched away after it had been shaped back part way to diffusion 113.

FIG. 2E shows the finished structure of this embodiment. Epitaxial layer 118 is grown over diffusion 113 defining discrete volumes for formation of semiconductor devices. This structure varies from the full etch technique of FIG. 1F, channel 27, by reason of having etched from surface 112 to layer 116 thereby requiring less depth for channel 127 to get completely to the oxide layer 116 than for channel 27 of FIG. 1F to get to oxide layer 16.

These two main embodiments are obviously only illustrative of the many variations to which this invention readily adapts itself. The spirit and scope of this invention, as those skilled in the art will appreciate, encompasses those variations.

I claim:

1. The process of manufacturing a high speed integrated circuit structure comprising the steps of:

a. diffusing a first selected impurity to form at least one buried layer region from one side of a semiconductive monocrystalline substrate;

b. forming an oxide layer on the one side of the substrate;

c. forming a support member over the oxide layer;

d. removing material from the other side of the substrate until the buried layer region is reached or nearly reached; and e. growing an epitaxial layer on the other side of the substrate over the buried layer region to provide at least one discrete region of a monocrystalline layer for desired further diffusions.

2. The process of claim 1 wherein the epitaxial layer is of N conductivity type and not more than 5 microns in thickness.

3. The process of claim 1 wherein the substrate is comprised of a first conductivity type silicon, the buried layer region is comprised of a second conductivity type and the epitaxial layer is comprised of a second conductivity type silicon having an impurity concentration less than that of the buried layer.

4. The process of claim 3 further comprising the step of:

k. etching through the epitaxial layer to provide partial dielectric isolation.

5. The process of claim 3 further comprising the step of:

i. etching through the epitaxial layer and the substrate to the oxide to provide full bottom dielectric isolation and air gap isolation in the lateral direction.

6. The process of claim 1, after the step of diffusing a selected impurity, further comprising the step of:

m. diffusing a second selected impurity to form a diffused region from the one side of the substrate, adjacent the buried layer region.

7. The process of claim 6 wherein the substrate is comprised of a first conductivity type silicon, the buried layer region is comprised of a second conductivity type, the diffused region is formed of the first conductivity type wherein the impurity concentration is heavier than that of the substrate to form a first section of a diffusion isolation barrier, and the epitaxial layer is of a second conductivity type silicon wherein the impurity concentration is less than that of the buried layer.

8. The process of manufacturing a high speed integrated circuit structure comprising the steps of:

a. diffusing a selected impurity uniformly into one side of a semiconductive monocrystalline substrate to form a uniform diffusion;

b. etching channels into the one side of the substrate to define at least one discrete area;

c. forming an oxide layer over the one side of the substrate and in the channels;

d. forming a support member over the oxide layer;

e. removing material from the other side of the substrate until a uniform diffusion is reached or nearly reached;

f. etching grooves through the other side of the substrate to the oxide layer in the channels, leaving at least one discrete section of the substrate; and g. growing an epitaxial layer over the remaining section of the substrate to provide a monocrystalline layer for desired further diffusions.

9. The process of manufacturing a high speed integrated circuit structure comprising the steps of:

a. diffusing a selective impurity uniformly into one side of a semiconductive monocrystalline substrate to form a uniform diffusion;

b. etching channels into the one side of the substrate to define at least one discrete area;

c. forming an oxide layer over the one side of the substrate and in the channels;

d. forming a support member over the oxide layer;

e. removing material from the other side of the substrate until the uniform diffusion is reached or nearly reached;

f. growing an epitaxial layer over the other side of the substrate to provide a monocrystalline layer for desired further diffusions; and g. etching grooves through the epitaxial layer and the other side of the substrate to the oxide layer in the channels thereby defining at least one discrete section of the substrate.

10. The process of claim 8 wherein the substrate is comprised of a first conductivity type silicon, the uniform diffusion is comprised of a second conductivity type to form a buried layer and the epitaxial layer is comprised of a second conductivity type silicon having a lesser impurity concentration than that of the uniform diffusion.

* * * * *